(12) United States Patent
Lee et al.

(10) Patent No.: US 11,381,214 B2
(45) Date of Patent: Jul. 5, 2022

(54) FREQUENCY FILTER CIRCUIT

(71) Applicant: Korea University Research and Business Foundation, Seoul (KR)

(72) Inventors: Ju Seop Lee, Seoul (KR); Jongheun Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 72 days.

(21) Appl. No.: 17/015,217

(22) Filed: Sep. 9, 2020

(65) Prior Publication Data

US 2021/0075390 A1 Mar. 11, 2021

(30) Foreign Application Priority Data

Sep. 10, 2019 (KR) .................. 10-2019-0111995
Aug. 25, 2020 (KR) .................. 10-2020-0107277

(51) Int. Cl.
*H03H 7/06* (2006.01)
*H03H 7/01* (2006.01)

(52) U.S. Cl.
CPC ............ *H03H 7/06* (2013.01); *H03H 7/0161* (2013.01)

(58) Field of Classification Search
CPC ............................ H03H 7/46; H03H 7/0161
USPC .................................................. 333/172, 176
See application file for complete search history.

(56) References Cited

U.S. PATENT DOCUMENTS

| 4,743,873 A | * | 5/1988 | Schultz | .................. H02M 1/14 333/12 |
| 5,659,464 A | * | 8/1997 | Esser | ...................... H02M 1/12 323/232 |

FOREIGN PATENT DOCUMENTS

| KR | 10-2009-0068511 A | 6/2009 |
| KR | 10-2015-0126493 A | 11/2015 |

* cited by examiner

*Primary Examiner* — Rakesh B Patel
(74) *Attorney, Agent, or Firm* — NSIP Law

(57) ABSTRACT

A reflectionless frequency filter circuit is provided. The reflectionless frequency filter circuit may include a first partial circuit including a first inductor and a first resistor connected in parallel with the first inductor, a first inverter connected in parallel with the first partial circuit, and a third partial circuit connected in series with the first inverter, and the third partial circuit may include a third inductor and a third resistor formed in a branch line between the first inverter and the third inductor.

13 Claims, 20 Drawing Sheets

FREQUENCY FILTER CIRCUIT

CROSS-REFERENCE TO RELATED APPLICATIONS

A claim for priority under 35 U.S.C. § 119 is made to Korean Patent Applications No. 10-2019-0111995 filed on Sep. 10, 2019 and No. 10-2020-0107277 filed on Aug. 25, 2020 in the Korean Intellectual Property Office, the entire contents of which are hereby incorporated by reference.

BACKGROUND

Embodiments of the inventive concept described herein relate to a frequency filter circuit.

A frequency filter is an electric circuit which allows a certain portion of the frequency to pass through from its input to its output. It (Frequency filter circuit) guarantees the back-end modules in an electronic system to have the pre-specified frequencies so that they (back-end modules) can perform the predefined operations. Hence, it (frequency filter circuit) is widely used in electronic systems such as wireless communication system, control system, and radar system, which conducts (electrical) signal processing.

(Frequency Filters) Filters can be categorized into four in regards of what function the filter performs. Lowpass filters let through low frequencies. Highpass filters let through high frequencies. Bandpass filters let through a certain band of frequencies. The passband of a filter is(are) the band(s) of frequencies that the filter lets through. The stopband of a filter is(are) the band(s) of frequencies that the filter blocks.

Conventionally, a filter (frequency filter) is designed such that the input impedance is matched to the port impedance only at its passband frequencies, while leaving the input impedance unmatched at its stopband frequencies. Hence, the input signal at the stopband is reflected. Since the reflected power affects the performance of the neighboring components as amplifiers, conventional filters (filter circuits) are required to be accompanied with an isolator which makes an electronic system bulky in size. Alternatively, reflectionless (absorptive) filters can take place of conventional reflective filters as they do not reflect the input signal at the stopband. Although a number of methods in designing reflectionless filters have been reported up to date, they (the design methods) have at least one of the following drawbacks: (1) One port is matched. (2) Perfect impedance matching is not available. (3) No synthesis method is provided. (4) Design method is limited by the order and/or the transmission response.

SUMMARY

Embodiments of the inventive concept provide a generalized reflectionless frequency filter topology capable of producing various transmission responses.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
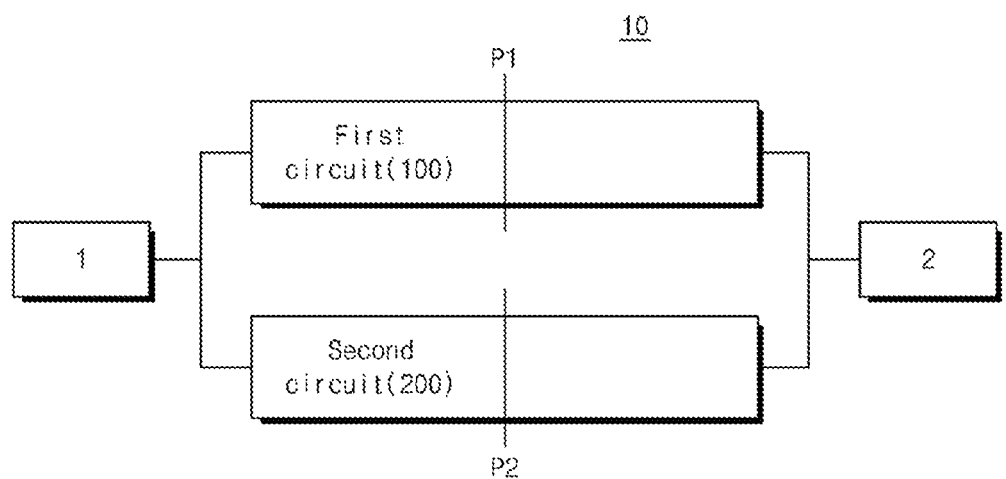
FIG. 1 shows the block diagram of an embodiment of the reflectionless frequency filter circuit.

FIG. 1 shows the block diagram of an embodiment of the reflectionless frequency filter circuit.

Referring to FIG. 1, the reflectionless frequency filter circuit 10 may have the first circuit 100 and the second circuit 200 and the first circuit 100 and the second circuit 200 are connected to each at least two ports 1 and 2 (hereinafter referred to as a first port and a second port, respectively). The first circuit 100 is sequentially arranged in series with the two ports 1 and 2 and/or the second circuit 200 is also sequentially arranged in series with the two ports 1 and 2. The first circuit 100 and the second circuit 200 are connected in parallel with each other.

According to an embodiment, both ports 1 and 2 are provided to receive electrical signals from the outside and output signals transmitted and modulated in the circuit 10 to the outside, or one of two ports 1 and 2 may be provided to receive an electrical signal and the other may be provided to output a signal transmitted and modulated in the circuit 10 to the outside. That is, both ports 1 and 2 are designed as input/output terminals, and one may be designed as an input terminal and the other may be designed as an output terminal.

According to an embodiment, each of the first circuit 100 and the second circuit 200 are symmetric with respect to its center lines p1 and p2. The center lines p1 and p2 refer to virtual lines that entirely divide the first circuit 100 or the second circuit 200. Here, when the circuits 100 and 200 are halved based on the center lines p1 and p2, one of the two halved parts to be connected to one 1 of plurality of ports 1 and 2 may be divided from the other to be connected to the other 2 of plurality of ports 1 and 2.

Hereinafter, various embodiments of the frequency filter circuit 10 described above will be described based on a detailed structure of each of the circuits 100 and 200.

Figure 2:
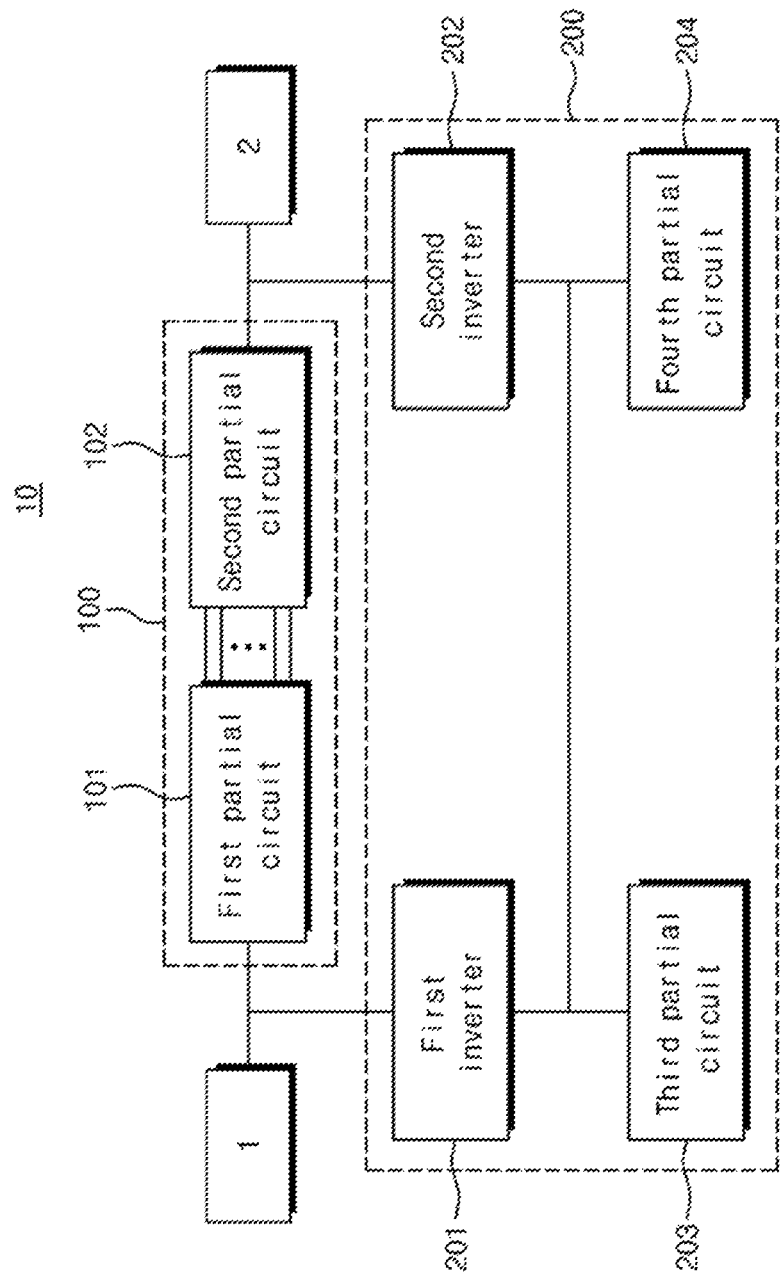
FIG. 2 shows the diagram for explaining an embodiment of the reflectionless frequency filter circuit.

FIG. 2 shows the diagram for explaining an embodiment of the reflectionless frequency filter circuit.

Referring to FIG. 2, the first circuit 100 of the frequency filter circuit 10 have the first partial circuit 101 and the second partial circuit 102. In this case, the partial circuits 101 and 102 are symmetrically implemented. That is, the partial circuits 101 and 102 have the same circuit elements. The circuit element(s) of each of the partial circuits 101 and 102 may be connected in the same or symmetrical form to allow the first circuit 100 to be generally symmetric. The first partial circuit 101 may be directly connected to one of the two ports 1 and 2 with the second partial circuit 102 directly connected to the other port. Although the first circuit 100 is shown to have two partial circuits 101 and 102, the first circuit 100 may have three or more partial circuits. Three or more partial circuits are designed symmetrically with respect to the line p1.

According to an embodiment, the second circuit 200 has the first inverter 201, the second inverter 202, the third partial circuit 203, and the fourth partial circuit 204. In this case, the first inverter 201 and the second inverter 202 are the same and the third partial circuit 203 and the fourth partial circuit 204 are the same. Accordingly, the second circuit 200 may be symmetric with respect to its center line p2. The first inverter 201 is connected to the first circuit 100 and port 1. The second inverter 202 is connected to the first circuit 100, port 2 and the first inverter 201. The third partial circuit 203 and the fourth partial circuit 204 may be located between the first inverter 201 and the second inverter 202. The third partial circuit 203 and the fourth partial circuit 204 may be branched from a point located between the first inverter 201 and the second inverter 202. The third partial circuit 203 may be located relatively close to the first inverter 203. The fourth partial circuit 204 may be located relatively close to the second inverter 202. The third partial circuit 203 and the fourth partial circuit 204 may be the same, thereby symmetric with respect to the line p2.

Figure 3:
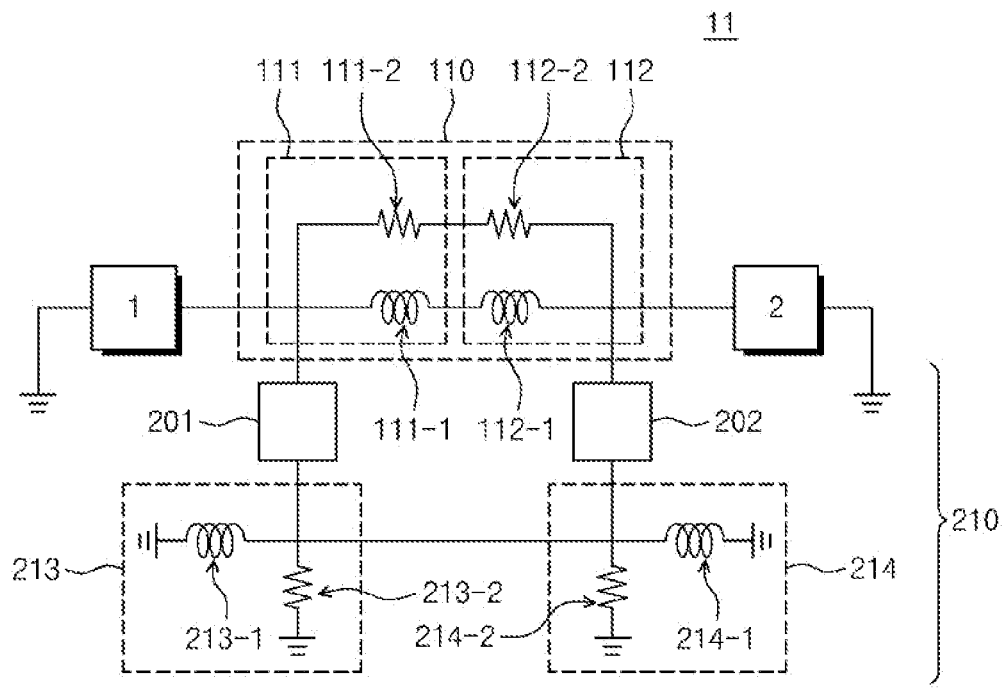
FIG. 3 shows the circuit diagram of the first embodiment of the reflectionless frequency filter circuit.

FIG. 3 shows the circuit diagram of the first embodiment of the reflectionless frequency filter circuit. Hereinafter, the first embodiment 11 of the first-order reflectionless frequency filter circuit will be described.

The reflectionless frequency filter circuit 11 of the first embodiment has the first circuit 110 and the second circuit 210. The first circuit 110 has the first partial circuit 111 and the second partial circuit 112. The second circuit has the first inverter 201, the second inverter 202, the third partial circuit 213, and the fourth partial circuit 214. In detail, the first partial circuit 111 has the first inductor 111-1 and the first resistor 111-2 connected in parallel. The second partial circuit has the second inductor 112-1 and the second resistor 112-2 connected in parallel. The first inductor 111-1 and the second inductor 112-1 are connected in series. The first resistor 111-2 and the second resistor 112-2 are connected in series.

The second circuit 210 has the first inverter 201, the second inverter 202, the third partial circuit 213, and the fourth partial circuit 214. They are interconnected to each other.

The third partial circuit 213 has the third resistor 213-2 and the third inductor 213-1. The third resistor 213-2 and the third inductor 213-1 are branched from a point between the first inverter 201 and the second inverter 202. The branch node of the third resistor 213-2 is located at a point between the first inverter 201 and the third inductor 213-1. Conversely, the third inductor 213-1 is located at a point between the first inverter 201 and the third resistor 213-2. The fourth partial circuit 214 has the fourth resistor 214-2 and the fourth inductor 214-1. The fourth resistor 214-2 and the fourth inductor 214-1 are branched from a point between the first inverter 201 and the second inverter 202. The third inductor 213-1, the third resistor 213-2, the fourth inductor 214-1 and the fourth resistor 214-2 may share the same branch node. The third inductor 213-1, the third resistor 213-2, the fourth inductor 214-1, and the fourth resistor 214-2 are connected in shunt.

Figure 4:
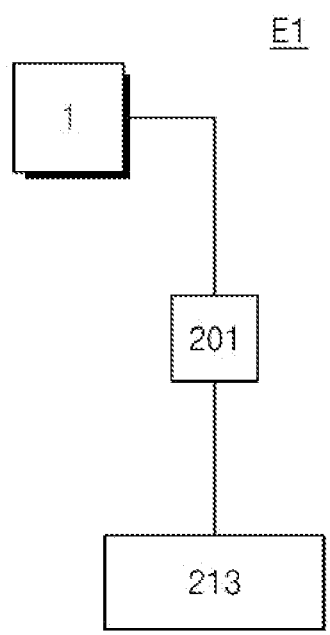
FIG. 4 shows the block diagram for explaining the even-mode excitation of the reflectionless frequency filter circuit.
Figure 5:
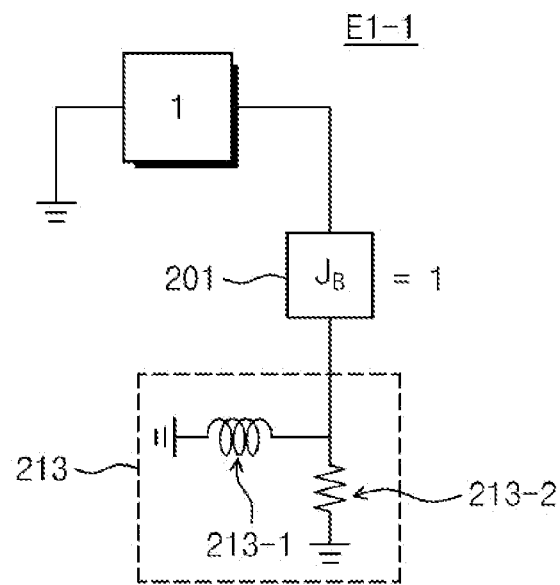
FIG. 5 shows the circuit diagram illustrating the even-mode half circuit of the first embodiment.
Figure 6:
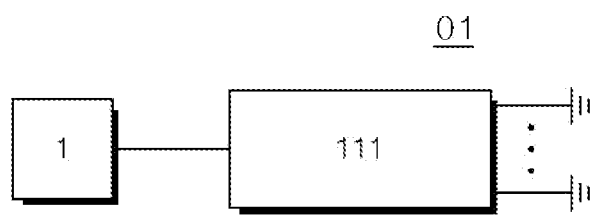
FIG. 6 shows the block diagram for explaining the odd-mode excitation of the reflectionless frequency filter circuit.
Figure 7:
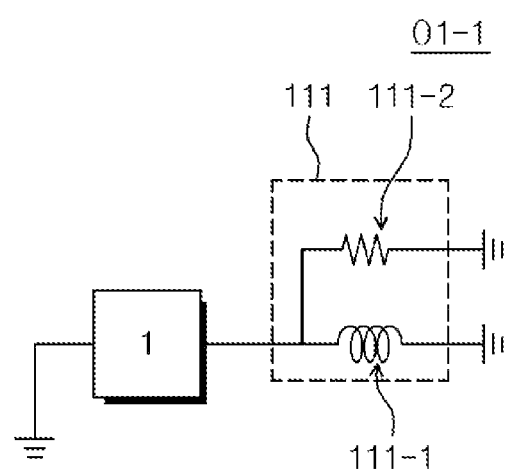
FIG. 7 shows the circuit diagram illustrating the odd-mode half circuit of the first embodiment.

FIG. 4 shows the block diagram for explaining the even-mode excitation of the reflectionless frequency filter circuit. FIG. 5 shows the circuit diagram illustrating an embodiment of the even-mode half circuit of a first-order lowpass filter. FIG. 6 shows block diagram for explaining the odd-mode excitation of the reflectionless frequency filter circuit. FIG. 7 shows the circuit diagram illustrating an embodiment of the even-mode half circuit of a first-order lowpass filter.

The reflectionless filter topology in FIG. 2 is symmetric with respect to its center, the even-mode half circuit can be found by replacing the center lines p1 and p2 by an open circuit. On the other hand, its odd-mode half circuit can be found by replacing the center lines p1 and p2 by a short circuit. The even-mode half circuit and the odd-mode half circuit have only one port.

Imposing the condition that the first partial circuit 101 and the first partial circuit 201 have no internal ground, the even-mode half circuit of the topology in FIG. 2 becomes a circuit having the first inverter 201 and the third partial circuit 213. The even mode half circuit E1 becomes a circuit having the first inverter 201, and the third partial circuit 203 connected in series (see FIG. 4). When the reflectionless frequency filter circuit 11 is given as shown in FIG. 3, its even mode half circuit E1-1 has the first inverter 201, the third inductor 213-1, and the third resistor 213-2. Here, the even mode circuit E1-1 may be constructed with the first inverter 201 and the third partial circuit 213 connected in series. The third partial circuit 213 is constructed as a ladder-type circuit having the third inductor 213-1 connected in shunt and the third resistor 213-2 connected in shunt (see FIG. 5).

As the input impedance to the immittance inverter 201 is infinity when the center lines are short circuits, the odd-mode half circuit of the topology in FIG. 2 becomes a circuit having the first partial circuit 101 terminated by ground. The odd mode half circuit O1 may become a circuit having the first partial circuit 111 (see FIG. 6). When the reflectionless frequency filter circuit 11 is given as illustrated in FIG. 3, its odd-mode half circuit O1-1 may be constructed with the first inductor 111-1 and the first resistor 111-2 (see FIG. 7).

The even-mode half circuit E1 consists of the first inverter 201, and the third partial circuit 213. The odd-mode half circuit O1 consists of the first partial circuit 111. Hence, the even-mode half circuit E1 and the odd-mode half circuit O1 are completely independent from each other. That is, the reflection coefficient $\Gamma_e$ of the even-mode half circuit E1 and the reflection coefficient $\Gamma_o$ of the odd-mode half circuit O1 may be controlled independently. This is because the reflection coefficient $\Gamma_e$ of the even mode half circuit E1 is determined by the first inverter 201 and the third partial circuit 203, and the reflection coefficient $\Gamma_o$ of the odd-mode half circuit O1 is determined by the first partial circuit 111.

In detail, the relationship between the S-parameters of the symmetric frequency filter circuit 10, the reflection coefficient $\Gamma_e$ of the even-mode half circuit E1 and the reflection coefficient $\Gamma_o$ of the odd-mode half circuit O1 are given by Equation 1 and Equation 2 below.

$$S_{11} = S_{22} = \frac{\Gamma_e + \Gamma_o}{2} \quad \text{[Equation 1]}$$

$$S_{12} = S_{21} = \frac{\Gamma_e + \Gamma_o}{2} \quad \text{[Equation 2]}$$

Here, $S_{11}$ denotes the port 1 voltage reflection ratio under the condition that port 2 is matched. $S_{22}$ denotes the port 2 voltage reflection ratio under the condition that port 1 is matched. $S_{12}$ denotes the reverse voltage gain under the condition that port 1 is matched. $S_{21}$ denotes the forward voltage gain under the condition that port 2 is matched.

To make the reflection coefficients of the reflectionless frequency filter circuit 10 to be zero, Equation 1 should be zero. In consideration of this, the following Equation 3 can be derived from Equation 1.

$$\Gamma_e = -\Gamma_o \quad \text{[Equation 3]}$$

Using the relationship between the reflection coefficient and the input admittance, Equation 3 can be expressed as Equation 4 below.

$$Y_e = Y_o^{-1} \quad \text{[Equation 4]}$$

Here, $Y_e$ and $Y_o$ denote input admittances of the even-mode half circuit and the odd-mode half circuit, respectively.

When Equation 3 is satisfied, the transmission coefficient of the filter circuit 10 can be derived from Equation 2. In this case, the transmission coefficients of the reflectionless frequency filter circuit 10 are given by Equation 5 as following.

$$S_{12} = S_{21} = \Gamma_o \quad \text{[Equation 5]}$$

According to the above-described Equations 1 to 5, the transmission and the reflection coefficients of the filter circuit 10 are determined by the reflection coefficient $\Gamma_e$ of the even-mode half circuit E1 and the reflection coefficient $\Gamma_o$ of the odd-mode half circuit O1. As the reflection coefficient $\Gamma_e$ of the even-mode half circuit E1 and the reflection coefficient $\Gamma_o$ of the odd-mode half circuit O1 are controlled independently, synthesizing a reflectionless filter for producing the predefined response can be carried out straightforwardly. For example, the reflectionless frequency filter circuit 11 of the first embodiment shown in FIG. 3 is designed such that it can produce the predefined Butterworth response with no reflections.

For convenience, the calculations below have been held under the assumption that the first inverter 201 and the second inverter 202 have the value of 1. (They) the first inverter 201 and the second inverter 202 may have the values other than 1 as long as they have the same value.

The power transmission ratio of the normalized first-order lowpass filter is given by Equation 6.

$$|S_{21}|^2 = \frac{1}{1 - s^2} (s = j\Omega) \quad \text{[Equation 6]}$$

Here, $\Omega$ is the normalized angular frequency. Under the assumption that the reflection coefficient of the reflectionless filter circuit 10 is 0, the reflection coefficient $\Gamma_e$ of the even-mode half-circuit E1 is given by Equation 7 as following.

$$\Gamma_o = S_{21} = (1+s)^{-1} \text{ or } (1-s)^{-1} \quad \text{[Equation 7]}$$

If we let the reflection coefficient $\Gamma_e$ of the even-mode half circuit to be $(1+s)^{-1}$, the reflection coefficient $\Gamma_o$ of the odd mode circuit O1 can be found as the following.

$$\Gamma_o = -\Gamma_e = -(1+s)^{-1} \quad \text{[Equation 8]}$$

When the port admittance is 1, the input admittance of the even-mode half circuit E1 can be calculated using Equation 8.

$$Y_e = \frac{1 - \Gamma_e}{1 + \Gamma_e} = \frac{s}{2 + s} \quad \text{[Equation 9]}$$

When the value of the first inverter 201 is 1, the input admittance $Y_B$ of the third partial circuit 213 can be calculated as following.

$$Y_B = Y_e^{-1} = 1 + 2s^{-1} \quad \text{[Equation 10]}$$

The even-mode half circuit E1-1 shown in FIG. 5 has the input admittance corresponding to the input admittance given in Equation 10. In this case, each element value of the inductor 213-1 and the resistor 213-2 in the even-mode half circuit E1-1 can be calculated using Equation 10. The element values of the inductor 213-1 and the resistor 213-2 are 0.5 and 1, respectively.

According to Equation 4, the first partial circuit 111 in FIG. 6 must be the same with the third partial circuit 213 in FIG. 4. Hence, the first partial circuit 111 in FIG. 7 must be constructed with an inductor 111-1 and a resistor 111-2. According to Equation 10, each value of the inductor 111-1 and the resistor 111-2 is the same with the value of the inductor 213-1 and the resistor 213-2. Hence, the element values of the inductor 111-1 and the resistor 111-2 are 0.5 and 1, respectively. resistor 213-2 of the third partial circuit 213, are given by 0.5 and 1, respectively.

The second partial circuit 112 and the fourth partial circuit 214 of FIG. 3 are provided such that the reflectionless filter circuit 11 is symmetric. Hence, each value of the inductor 112-1 and the resistor 112-2 is the same with the value of the inductor 111-1 (0.5) and the resistor 111-2 (1), respectively. In addition, each value of the inductor 214-1 and the resistor 214-2 is the same with the value of the inductor 213-1 (0.5) and the resistor 213-2 (1).

Figure 8:
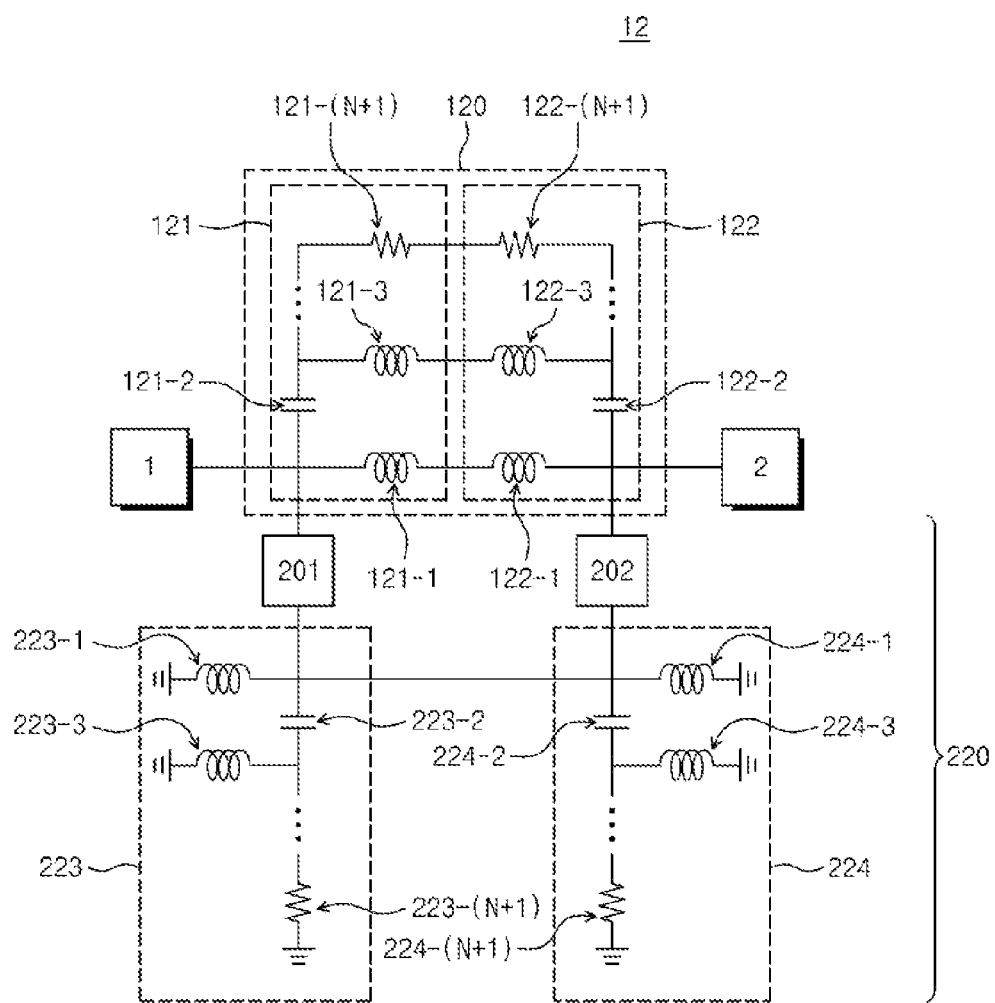
FIG. 8 shows the circuit diagram of the second embodiment of the reflectionless frequency filter circuit.

FIG. 8 shows the circuit diagram of the second embodiment of the reflectionless frequency filter circuit.

Higher-order reflectionless filter circuits can be formulated using the synthesis process described in FIGS. 3 to 7.

The reflectionless frequency filter circuit 12 must consist the first circuit 120 composed of the first partial circuit 121 and the second partial circuit 122, and the second circuit 220 composed of the first inverter 201, the second inverter 202, the third partial circuit 223, and the fourth partial circuit 224.

The first partial circuit 121 has the elements from 121-1 to 121-(N+1). For an Nth-order reflectionless filter (N>1), the first partial circuit 121 has at least one inductor 121-1, one capacitor 121-2, and a resistor 121-(N+1). The order of the filter can be increased by inserting an inductor 121-(2i+1) with one end connected between the capacitor 121-(2i) and the resistor 121-(N+1), and the other connected to the center plane p1. Furthermore, the order of the filter can be increased by inserting a capacitor 121-(2i) with one end connected to the branching node of the inductor 121-(2i−1) and the other connected to the resistor 121-(N+1).

The second partial circuit 122 is the same with the first partial circuit 121, as the filter circuit 12 is symmetric with respect to its center plane p1. For an Nth-order reflectionless filter (N>1), the second partial circuit 122 has at least one inductor 122-1, one capacitor 122-2, and a resistor 122-(N+1). The order of the filter can be increased by inserting an inductor 122-(2i+1) with one end connected between the capacitor 122-(2i) and the resistor 122-(N+1), and the other connected to the center plane p1. Furthermore, the order of the filter can be increased by inserting a capacitor 122-(2i) with one end connected to the branching node of the inductor 122-(2i−1) and the other connected to the resistor 122-(N+1).

Each inductor 121-(2i+1) in the first partial circuit 121 must be connected with its corresponding pair inductor 122-(2i+1) in the second partial circuit 122. Accordingly, the resistor 121-(N+1) in the first partial circuit 121 must be connected with its corresponding pair resistor 122-(N+1) in the second partial circuit 122.

The third partial circuit 123 has the elements from 123-1 to 123-(N+1). For an Nth-order reflectionless filter (N>1), the first partial circuit 121 has at least one inductor 123-1, one capacitor 123-2, and a resistor 123-(N+1). The order of the filter can be increased by inserting a shunt inductor 123-(2i+1) with its end connected between the capacitor 123-(2i) and the shunt resistor 123-(N+1). Furthermore, the order of the filter can be increased by inserting a capacitor 123-(2i) with one end connected to the branching node of the shunt inductor 123-(2i−1) and the other connected to the shunt resistor 123-(N+1).

The fourth partial circuit 124 is the same with the third partial circuit 123, as the filter circuit 12 is symmetric with respect to its center plane p2. For an Nth-order reflectionless filter (N>1), the fourth partial circuit 124 has at least one inductor 124-1, one capacitor 124-2, and a resistor 124-(N+1). The order of the filter can be increased by inserting a shunt inductor 124-(2i+1) with its end connected between the capacitor 124-(2i) and the shunt resistor 124-(N+1). Furthermore, the order of the filter can be increased by inserting a capacitor 124-(2i) with one end connected to the branching node of the shunt inductor 124-(2i−1) and the other connected to the shunt resistor 124-(N+1).

The first inverter 201 and the second inverter 202 are the same.

The reflectionless frequency filter circuit 12 according to the second embodiment is a reflectionless lowpass filter, and it can produce an Nth-order Butterworth or inverse-Chebyshev transmission response.

When each of the elements 121-1 to 121-(N+1), 122-1 to 122-(N+1), 223-1 to 223-(N+1), 224-1 to 224-(N+1) of the frequency filter circuit 12 according to the second embodiment has a specific value, the reflectionless frequency filter circuit 12 produces the Butterworth response. The values of the elements 121-1 to 121-(N+1), 122-1 to 122-(N+1), 223-1 to 223-(N+1), 224-1 to 224-(N+1) can be obtained by using the similar method described in FIG. 4 to FIG. 7. The only difference is to set $S_{21}$ in Equation 6 by an Nth-order Butterworth transfer function. the normalized element values of elements 121-1 to 121-(N+1), 122-1 to 122-(N+1), 223-1 to 223-(N+1), 224-1 to 224-(N+1) are different depending on the order of the filter.

In detail, for N=2, each partial circuit 121, 122, 223, and 224 consists of an inductor, a capacitor and a resistor. The inductors 121-1, 122-1, 223-1, and 224-1 have the value of 0.7071. The capacitors 121-2, 122-2, 223-2, and 224-2 have the value of 0.7071. The resistors 121-(N+1), 122-(N+1), 223-(N+1), and 224-(N+1) has the value of 1.

For N=3, each partial circuit 121, 122, 223, and 224 consists of two inductors, a capacitor and a resistor. The inductors 121-1, 122-1, 223-1, and 224-1 have the value of 1. The capacitors 121-2, 122-2, 223-2, and 224-2 have the value of 0.5. The inductors 121-1, 122-1, 223-1, and 224-1 have the value of 1. The resistors 121-(N+1), 122-(N+1), 223-(N+1), and 224-(N+1) has the value of 1.

For N=4, each partial circuit 121, 122, 223, and 224 consists of two inductors, two capacitors and a resistor. The inductors 121-1, 122-1, 223-1, and 224-1 have the value of 1.306. The capacitors 121-2, 122-2, 223-2, and 224-2 have the value of 0.5411. The inductors 121-3, 122-3, 223-3, and 224-3 have the value of 0.5411. The capacitors 121-4, 122-4, 223-4, and 224-4 have the value of 0.5411. The resistors 121-(N+1), 122-(N+1), 223-(N+1), and 224-(N+1) has the value of 1.

For N=5, each partial circuit 121, 122, 223, and 224 consists of three inductors, two capacitors and a resistor. The inductors 121-1, 122-1, 223-1, and 224-1 have the value of 1.618. The capacitors 121-2, 122-2, 223-2, and 224-2 have the value of 0.618. The inductors 121-3, 122-3, 223-3, and 224-3 have the value of 0.5. The capacitors 121-4, 122-4, 223-4, and 224-4 have the value of 0.618. The inductors 121-5, 122-5, 223-5, and 224-5 have the value of 1.618. The resistors 121-(N+1), 122-(N+1), 223-(N+1), and 224-(N+1) has the value of 1.

When each of the elements 121-1 to 121-(N+1), 122-1 to 122-(N+1), 223-1 to 223-(N+1), 224-1 to 224-(N+1) of the frequency filter circuit 12 according to the second embodiment has a specific value, the reflectionless frequency filter circuit 12 produces the inverse-Chebyshev response. The values of the elements 121-1 to 121-(N+1), 122-1 to 122-(N+1), 223-1 to 223-(N+1), 224-1 to 224-(N+1) can be obtained by using the similar method described in FIG. 4 to FIG. 7. The only difference is to set $S_{21}$ in Equation 6 by an Nth-order Chebyshev transfer function. Normalized element values for 20 dB inverse-Chebyshev responses are given below.

In detail, for N=2, each partial circuit 121, 122, 223, and 224 consists of an inductor, a capacitor and a resistor. The inductors 121-1, 122-1, 223-1, and 224-1 have the value of 1.5042. The capacitors 121-2, 122-2, 223-2, and 224-2 have the value of 1.8165. The resistors 121-(N+1), 122-(N+1), 223-(N+1), and 224-(N+1) has the value of 0.819.

For N=3, each partial circuit 121, 122, 223, and 224 consists of two inductors, a capacitor and a resistor. The inductors 121-1, 122-1, 223-1, and 224-1 have the value of 1.1742. The capacitors 121-2, 122-2, 223-2, and 224-2 have the value of 0.9064. The inductors 121-1, 122-1, 223-1, and 224-1 have the value of 1.1742. The resistors 121-(N+1), 122-(N+1), 223-(N+1), and 224-(N+1) has the value of 1.

For N=4, each partial circuit 121, 122, 223, and 224 consists of two inductors, two capacitors and a resistor. The inductors 121-1, 122-1, 223-1, and 224-1 have the value of 1.0736. The capacitors 121-2, 122-2, 223-2, and 224-2 have the value of 0.774. The inductors 121-3, 122-3, 223-3, and 224-3 have the value of 0.6339. The capacitors 121-4, 122-4, 223-4, and 224-4 have the value of 1.3109. The resistors 121-(N+1), 122-(N+1), 223-(N+1), and 224-(N+1) has the value of 0.819.

For N=5, each partial circuit 121, 122, 223, and 224 consists of three inductors, two capacitors and a resistor. The inductors 121-1, 122-1, 223-1, and 224-1 have the value of 1.0294. The capacitors 121-2, 122-2, 223-2, and 224-2 have the value of 0.7288. The inductors 121-3, 122-3, 223-3, and 224-3 have the value of 0.5551. The capacitors 121-4, 122-4, 223-4, and 224-4 have the value of 0.7288. The inductors 121-5, 122-5, 223-5, and 224-5 have the value of 1.0294. The resistors 121-(N+1), 122-(N+1), 223-(N+1), and 224-(N+1) has the value of 1.

Figure 9:
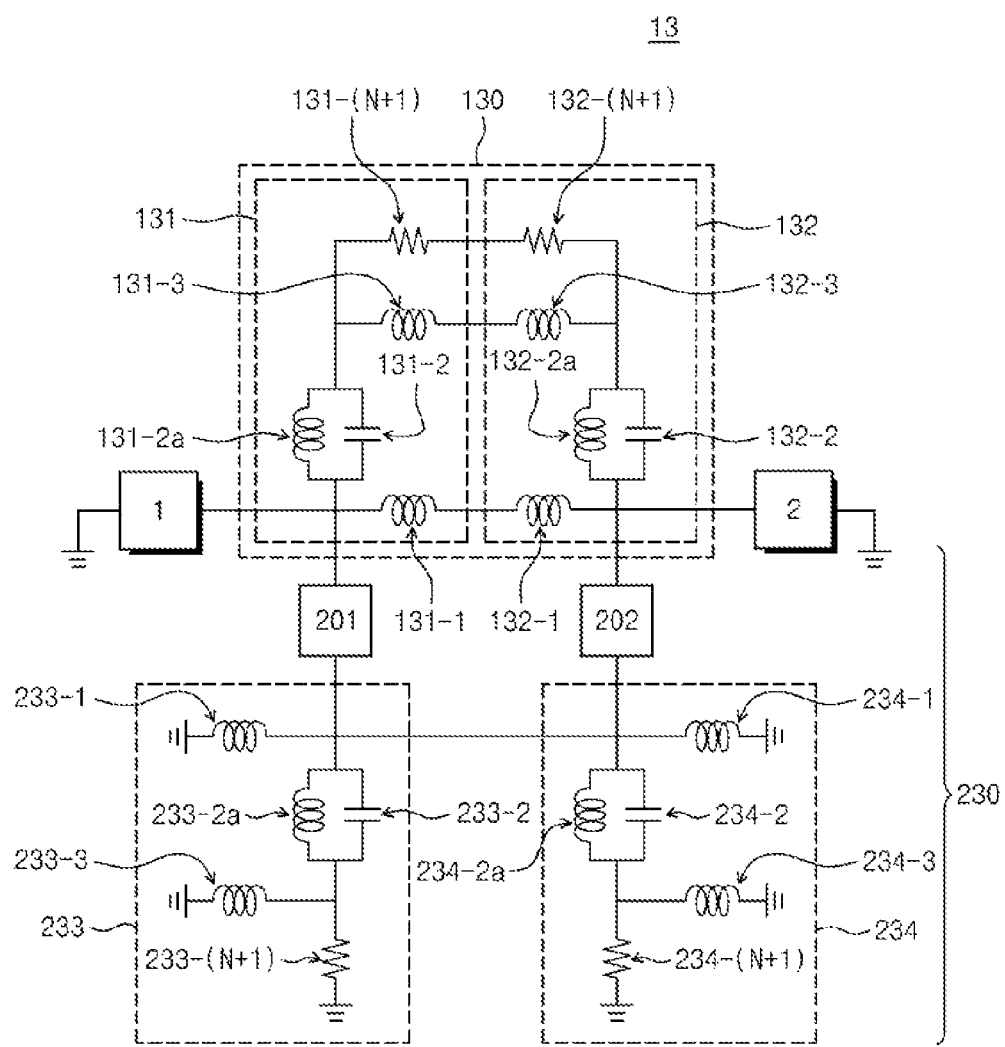
FIG. 9 shows the circuit diagram of the third embodiment of the reflectionless frequency filter circuit.

FIG. 9 shows the circuit diagram of the third embodiment of the reflectionless frequency filter circuit.

The reflectionless filter circuit 13 is a third-order lowpass filter. The only difference with the second embodiment 12 with N=3 is that the capacitors 121-1, 122-2, 223-3, and 224-3 have been replaced by parallel resonators (131-2 and 131-2a), (132-2 and 132-2a), (233-2 and 233-2a), and (234-2 and 234-2a).

The reflectionless filter circuit 13 of the third embodiment is more general in that it is capable produce the third-order Chebyshev or elliptic transmission responses which has ripples in the passband. In detail, the reflectionless filter circuit 13 reduces to the reflectionless circuit 12 with N=3, when the values of the inductors 131-2a, 132-2a, 233-2a, and 234-2a are infinity (i.e. open circuit).

The normalized element values for Chebyshev response having 0.1 dB ripple in the passband is given as the following. The inductors 131-1, 132-1, 233-1, and 234-1 have the value of 1.0324. The capacitors 131-2, 132-2, 233-2, and 234-2 have the value of 0.5163. The inductors 131-2a, 132-2a, 233-2a, and 234-2a have the value of 2.58. The resistors 131-(N+1), 132-(N+1), 233-(N+1), and 234-(N+1) have the value of 1. The normalized element values are for 0.1 dB Chebyshev response whose 3 dB cut-off frequency is at 0=1.

Figure 10:
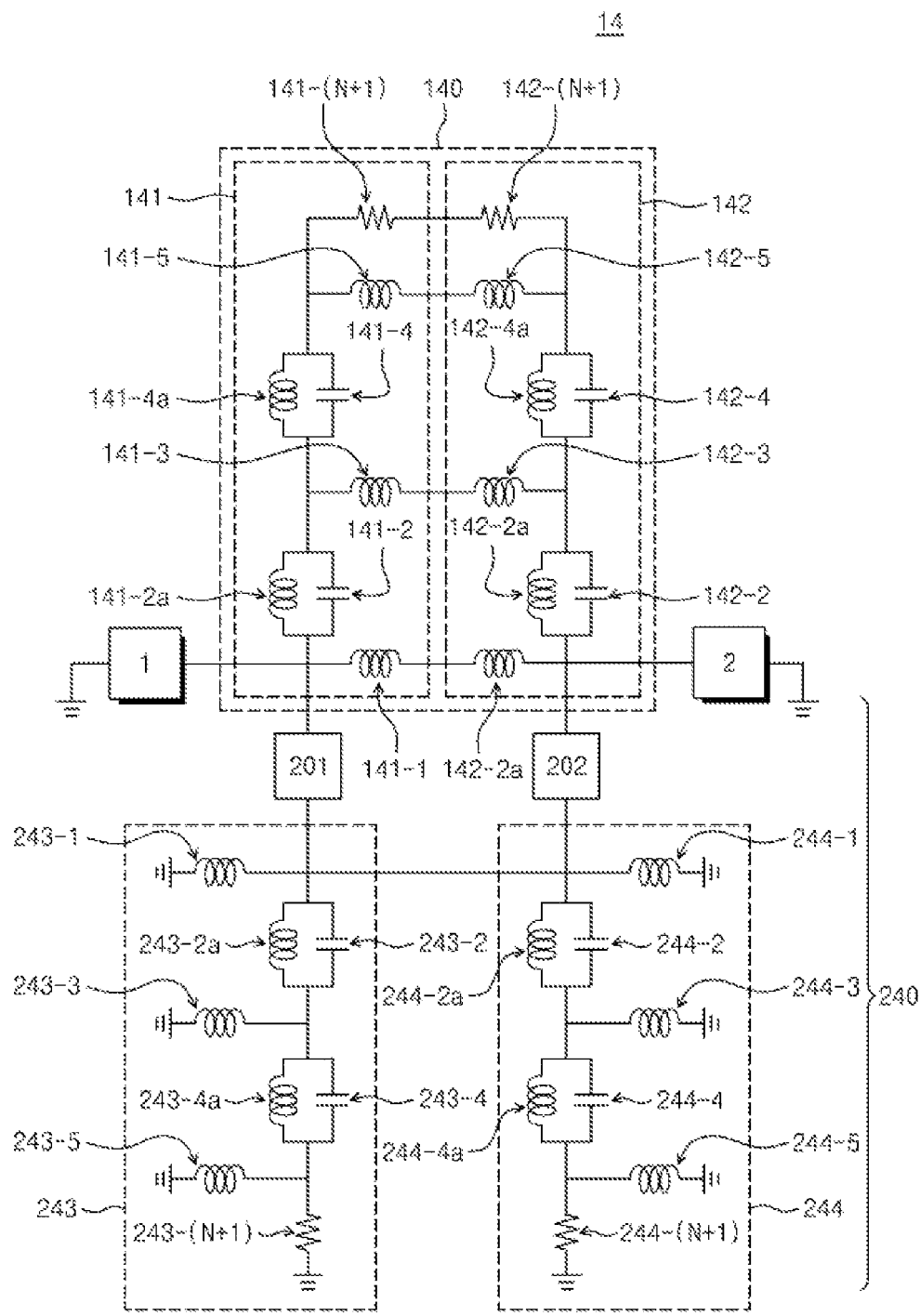
FIG. 10 shows the circuit diagram of the fourth embodiment of the reflectionless frequency filter circuit.
Figure 11:
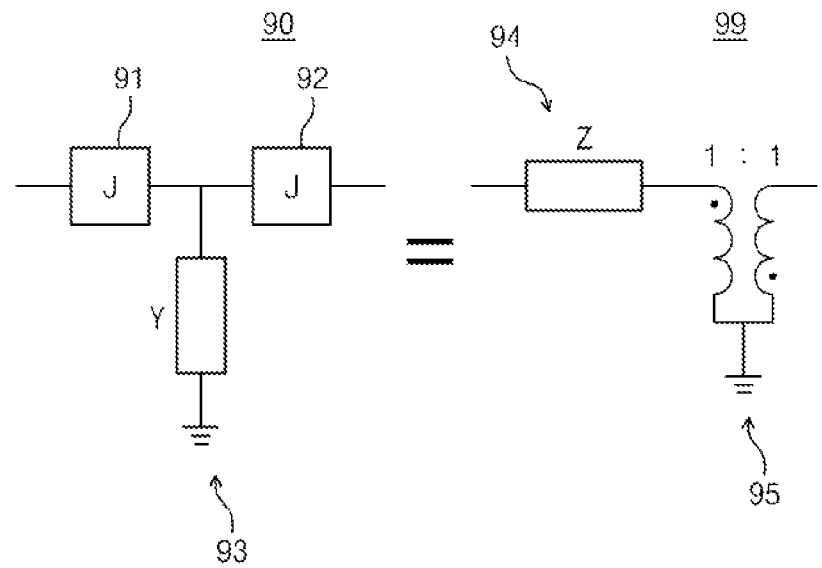
FIG. 11 shows the circuit diagram for explaining a circuit equivalent to a shunt circuit between two immittance inverters.

FIG. 10 shows the circuit diagram of the fourth embodiment of the reflectionless filter circuit.

The reflectionless filter circuit 14 is a fifth-order lowpass filter. The only difference with the second embodiment 12 with N=5 is that the capacitors 121-1, 122-2, 223-3, 224-3, 121-5, 122-5, 223-5, 224-5 have been replaced by parallel resonators (141-2 and 141-2a), (142-2 and 142-2a), (243-2 and 243-2a), (244-2 and 244-2a), (141-4 and 141-4a), (142-4 and 142-4a), (243-4 and 244-2a), and (244-4 and 244-4a).

As is the case with the reflectionless filter circuit 13, the reflectionless filter circuit 15 is more general in that it is capable produce the fifth-order Chebyshev or elliptic transmission responses. In detail, the reflectionless filter circuit 14 reduces to the reflectionless circuit 12 with N=5, when the values of the inductors 141-2a, 142-2a, 243-2a, 244-2a, 141-4a, 142-4a, 243-4a, 244-4a are infinity (i.e. open circuit).

The normalized element values for elliptic response having 0.1 dB and 20 dB ripple at the passband and the stopband, respectively, is given as the following. The inductors 141-1, 142-1, 243-1, and 244-1 have the value of 1.565. The capacitors 141-2, 142-2, 243-2, and 244-2 have the value of 1.124. The inductors 141-2a, 142-2a, 243-2a, and 244-2a have the value of 1.953. The inductors 141-3, 142-3, 243-3 and 244-3 have the value of 0.8676. The capacitors 141-4, 142-4, 243-4, and 244-4 have the value of 3.285. The inductors 141-4a, 142-4a, 243-4a, and 244-4a have the value of 0.3839. The inductors 141-5, 142-5, 243-5 and 244-5 have the value of 13.49. The resistors 131-(N+1), 132-(N+1), 233-(N+1), and 234-(N+1) have the value of 1. The normalized element values are for elliptic response having 0.1 dB and 20 dB ripple at the passband and the stopband, respectively, whose stopband ripple start at Ω=1.

Figure 13:
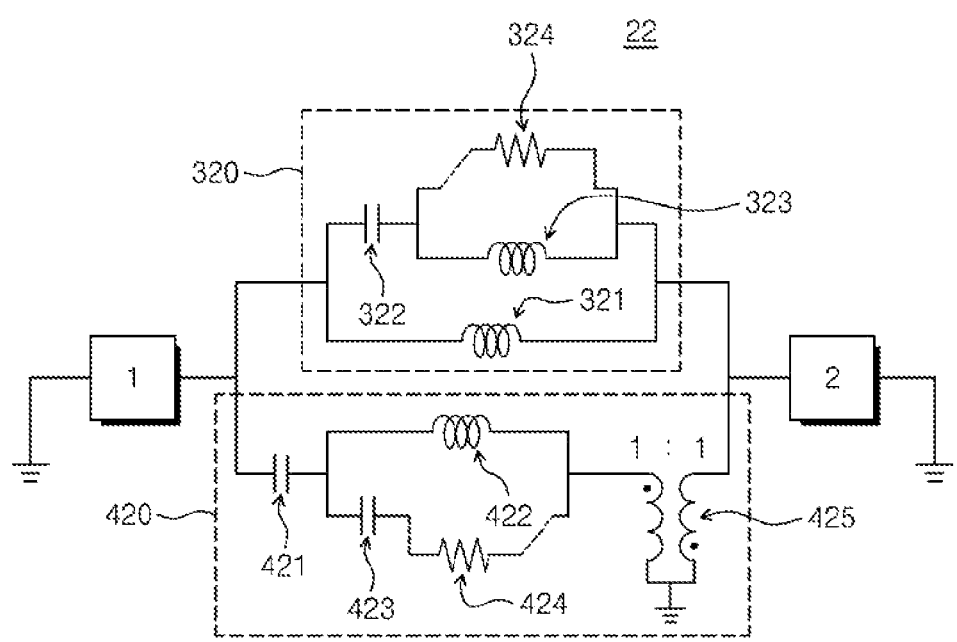
FIG. 13 shows the circuit diagram of the sixth embodiment of the reflectionless frequency filter circuit equivalent to the second embodiment.

FIG. 13 show the equivalent circuit of a shunt circuit between two immittance inverters.

Referring to FIG. 13, a circuit 90 containing two inverters 91 and 92 having the same value and a shunt circuit 93 connected to the branch node located between the two inverters 91 and 92 is equivalent to a circuit 99 containing a series circuit 94 and a −1:1 transformer 95. They are equivalent when the following condition is satisfied.

$$Z = J^2 Y \qquad \text{[Equation 11]}$$

Using that the two circuit 90 and 99 are equivalent circuit, the reflectionless filter circuits from 11 to 14 can be transformed into the reflectionless filter circuits from 21 to 24, which have a smaller number of elements.

Figure 14:
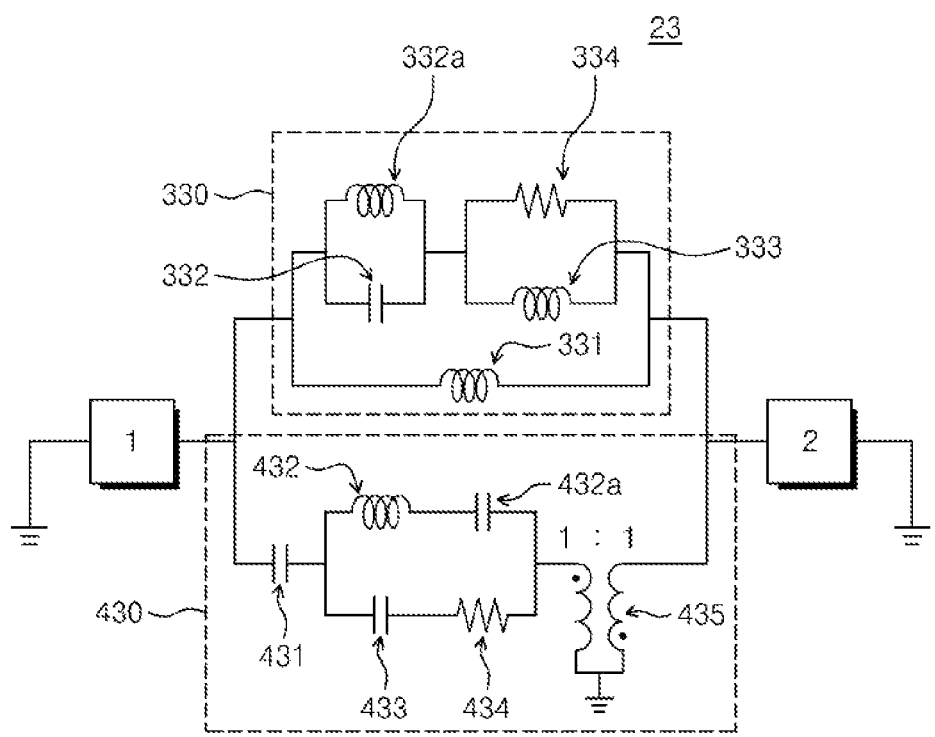
FIG. 14 shows the circuit diagram for the seventh embodiment of the reflectionless frequency filter circuit equivalent to the third embodiment.

FIG. 14 shows the circuit diagram for the fifth embodiment of the reflectionless frequency filter circuit equivalent to the first embodiment.

Figure 12:
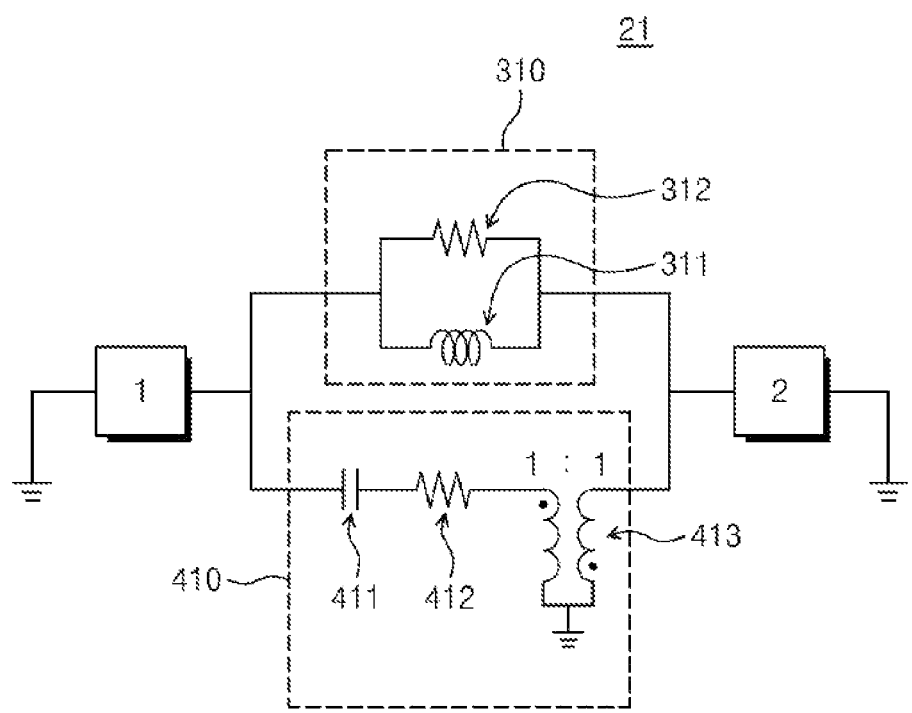
FIG. 12 shows the circuit diagram of the fifth embodiment of the reflectionless frequency filter circuit equivalent to the first embodiment.

As the reflectionless filter circuit 11 is symmetric with respect to its center, each element has its pairs. For example, the inductor 111-1 in the first partial circuit 111 has the pair inductor 112-1 in the second partial circuit 112. Two inductors in this pair can be replaced by a single inductor. Accordingly, the first circuit 110 having the first partial circuit 111 and the second partial circuit 112 can be reduced to the first circuit 310 (See. FIG. 12). In this case, the inductor 311 of the first circuit 310 has 2 times the value of each inductor 111-1 and 112-1. The resistor 312 has ½ times the conductance of each resistor 111-2 and 112-2.

Similarly, the inductor 213-1 in the third partial circuit 213 has the pair inductor 213-1 in the fourth partial circuit 214. Two inductors in this pair can be replaced by a single inductor. Accordingly, the third partial circuit 213 and the fourth partial circuit 214 replaced by a circuit having a smaller number of elements, which is not shown in this specification. Furthermore, the second circuit 210 containing two inverters 201 and 202 and the circuit superseding the third partial circuit 213 and the fourth partial circuit 214 can be transformed into the second circuit 410 (See. FIG. 12). In this case the capacitor 411 of the second circuit 410 has ½ times the value of each inductor 213-1 and 214-1. The resistor 412 has 2 times the resistance of each resistor 213-2 and 214-2.

When each element has the value described above, the reflectionless filter circuit 21, the fifth embodiment, is a first-order lowpass filter.

FIG. 13 shows the circuit diagram of the sixth embodiment of the reflectionless frequency filter circuit equivalent to the second embodiment.

The reflectionless filter circuit 12, the second embodiment illustrated in FIG. 8, can be transformed into the reflectionless filter circuit 22, the sixth embodiment, which has a small number of circuit elements. It has been derived using the same process used for deriving the reflectionless filter circuit 21 from the reflectionless filter circuit 11. In this case, the first inductor 321 in the first circuit 320 has the 2 times the value of each inductor 121-1 and 122-1 of the reflectionless filter circuit 12. The first capacitor 322 in the first circuit 320 has the ½ times the value of each capacitor 121-2 and 122-2 of the reflectionless filter circuit 12. In general, the i-th inductor in the first circuit 320 has the 2 times the value of the corresponding inductor in the first circuit 120, and the i-th capacitor in the first circuit 320 has the ½ times the value of the corresponding capacitor in the first circuit 120. The first resistor 324 in the first circuit 320 has the 2 times the resistance (½ times the conductance) of each resistor 121-(N+1) and 122-(N+1). Accordingly, the first capacitor 421 in the second circuit 420 has the ½ times the value of each inductor 223-1 and 224-1. The first inductor 422 in the second circuit 420 has the 2 times the value of each capacitor 223-2 and 224-2. In general, the i-th capacitor in the second circuit 420 has the ½ times the value of the corresponding inductor in the second circuit 220, and the i-th inductor in the second circuit 420 has the 2 times the value of the corresponding capacitor in the filter circuit 120. The first resistor 424 in the second circuit 420 has the 2 times the resistance (½ times the conductance) of each resistor 223-(N+1) and 224-(N+1).

When each element has the value described above, the reflectionless filter circuit 22, the sixth embodiment, has the capability to produce an Nth-order Butterworth or inverse-Chebyshev transmission response as the reflectionless filter circuit 12.

FIG. 14 shows the circuit diagram for the seventh embodiment of the reflectionless frequency filter circuit equivalent to the third embodiment.

The reflectionless filter circuit 13, the third embodiment illustrated in FIG. 8, can be transformed into the reflectionless filter circuit 23, the seventh embodiment, which has a small number of circuit elements. It has been derived using the same process used for deriving the reflectionless filter circuit 21 from the reflectionless filter circuit 11.

The reflectionless filter circuit 23 is a third-order lowpass filter. The only difference with the sixth embodiment 22 with N=3 is that the capacitor 322 and the inductor 422 have been replaced by the parallel resonator (332 and 332a) and the series resonator (432 and 432a), respectively.

The reflectionless filter circuit 23, the seventh embodiment is more general in that it is capable produce the third-order Chebyshev or elliptic transmission responses which has ripples in the passband. In detail, the reflectionless filter circuit 23 reduces to the reflectionless circuit 22 with N=3, when the value of the inductor 332a and the capacitor 432a are both infinity. In this case, the first inductor 331 in the first circuit 330 has 2 times the value of each inductor 131-1 and 132-1 of the reflectionless filter circuit 13. The first capacitor 332 has ½ times the value of each capacitor 131-2 and 132-2 of the reflectionless filter circuit 13. The second inductor 332a has 2 times the value of each inductor 131-2a and 132-2a. The third inductor 333 has 2 times the value of each inductor 131-3 and 132-3. The first resistor 334 has 2 times the resistance of each resistor 131-4 and 132-4. Accordingly, the first capacitor 431 in the second circuit 430 has ½ times the value of each inductor 223-1 and 234-1. The first inductor 432 has 2 times the value of each capacitor 233-2 and 234-2. The second capacitor 432a has ½ times the value of each inductor 233-2a and 234-2a. The third capacitor 433 has ½ times the value of each inductor 233-3 and 234-3. The first resistor 434 has 2 times the resistance of each resistor 233-4 and 234-4.

Figure 15:
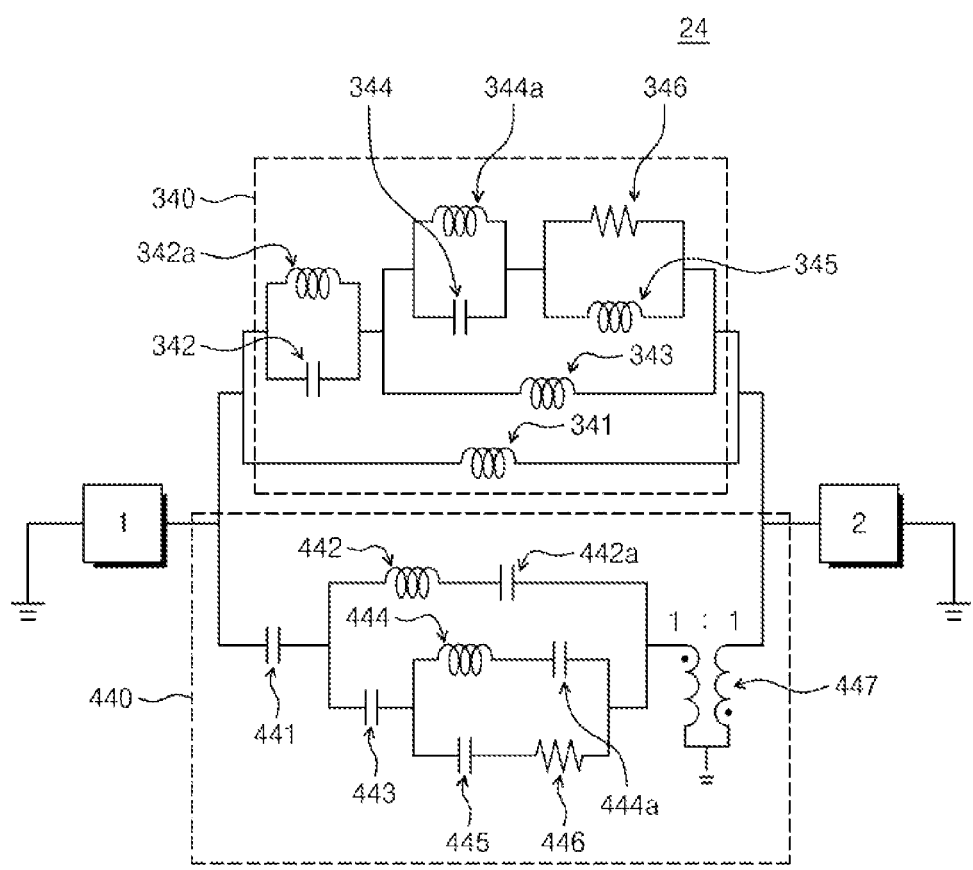
FIG. 15 shows the circuit diagram for the eighth embodiment of the reflectionless frequency filter circuit equivalent to the fourth embodiment.

FIG. 15 shows the circuit diagram for the eighth embodiment of the reflectionless frequency filter circuit equivalent to the fourth embodiment.

The reflectionless filter circuit 14, the fourth embodiment illustrated in FIG. 10, can be transformed into the reflectionless filter circuit 24, the eighth embodiment, which has a small number of circuit elements. It has been derived using the same process used for deriving the reflectionless filter circuit 21 from the reflectionless filter circuit 11.

The reflectionless filter circuit 24 is a fifth-order lowpass filter, and it has a smaller number of elements compared to the reflectionless filter circuit 14. It is more general compared to the reflectionless filter circuit 13 with N=5 in that it is capable to produce the fifth-order Chebyshev and elliptic transmission responses, which has ripples in the passband. In this case, the first inductor 341 in the first circuit 340 has 2 times the value of each inductor 141-1 and 142-1 of the reflectionless filter circuit 14. The first capacitor 342 has ½ times the value of each capacitor 141-2 and 142-2. The second inductor 342a has 2 times the value of each inductor 141-2a and 142-2a. The third inductor 343 has 2 times the value of each inductor 141-3 and 142-3. The second capacitor 344 has ½ times the value of each capacitor 141-4 and 142-4. The fourth inductor 344a has 2 times the value of each inductor 141-4a and 142-4a. The fifth inductor 345 has 2 times the value of each inductor 141-5 and 142-5. The first resistor 346 has 2 times the resistance of each resistor 141-6 and 142-6. Accordingly, the first capacitor 441 in the second circuit 440 has ½ times the value of each inductor 243-1 and 244-1 of the reflectionless filter circuit 14. The first inductor 442 has 2 times the value of each capacitor 243-2 and 244-2. The second capacitor 442a has ½ times the value of each inductor 243-2a and 244-2a. The third capacitor 443 has ½ times the value of each inductor 243-3 and 244-3. The second inductor 444 has 2 times the value of each capacitor 243-4 and 244-4. The fourth capacitor 444a has ½ times the value of each inductor 243-4a and 244-4a. The fifth capacitor 445 has ½ times the value of each inductor 243-5 and 244-5. The first resistor 446 has 2 times the resistance of each resistor 243-6 and 244-6.

Figure 16:
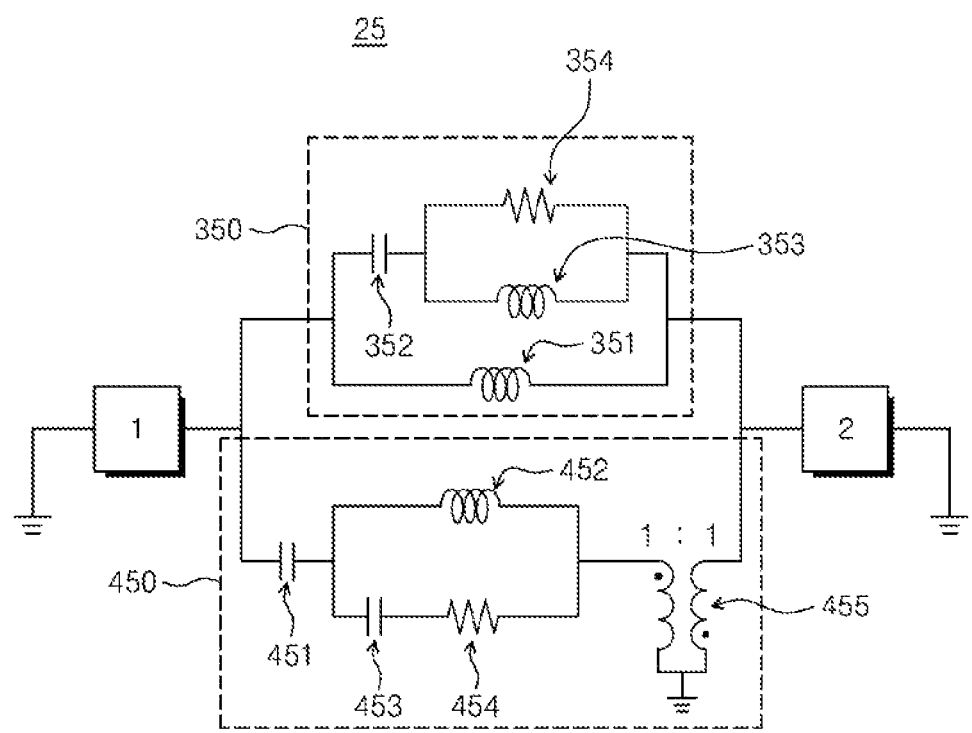
FIG. 16 shows the circuit diagram of a third-order (reflectionless) Butterworth lowpass filter, the ninth embodiment of the reflectionless frequency filter circuit.
Figure 17:
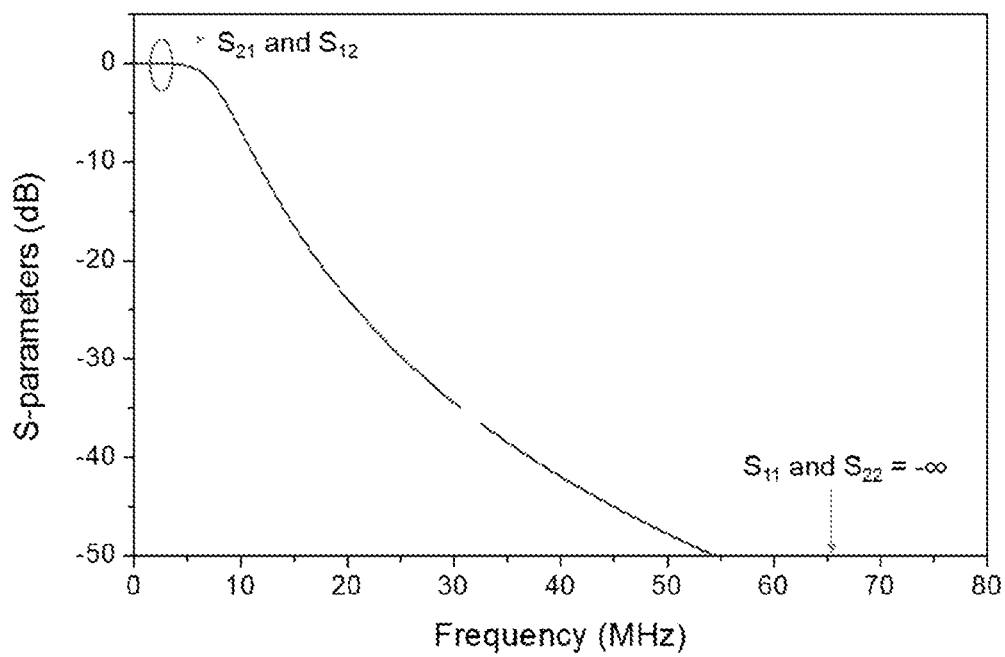
FIG. 17 illustrates the frequency responses of the third-order reflectionless Butterworth lowpass filter.
Figure 18:
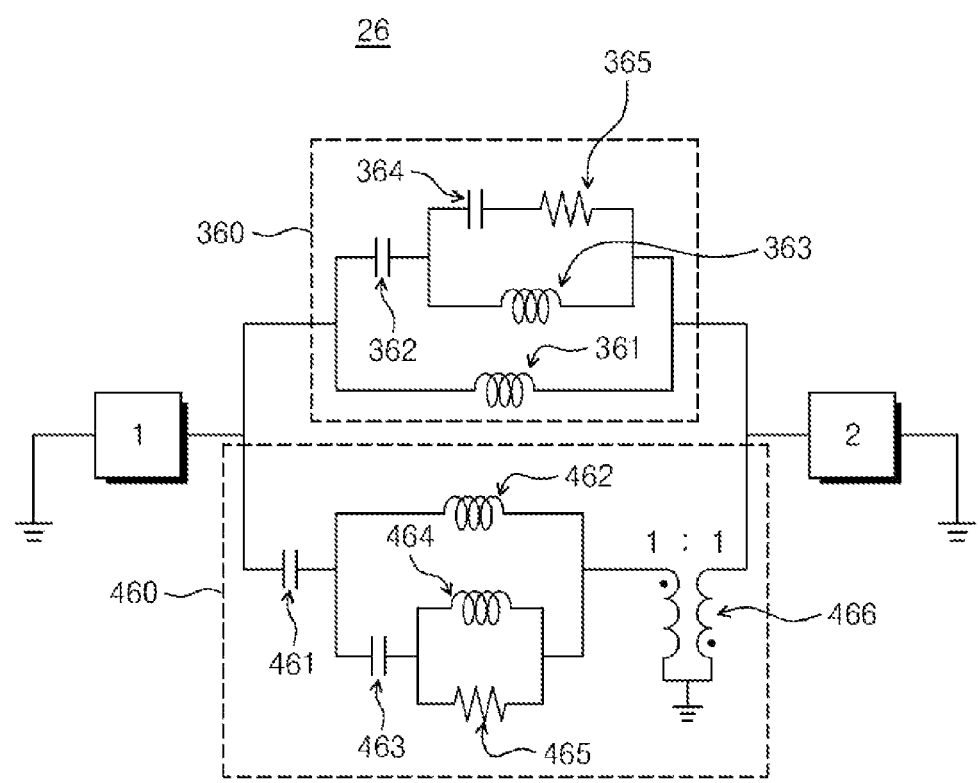
FIG. 18 shows the circuit diagram of a fourth-order (reflectionless) 20 dB inverse-Chebyshev lowpass filter, the tenth embodiment of the reflectionless frequency filter circuit.
Figure 19:
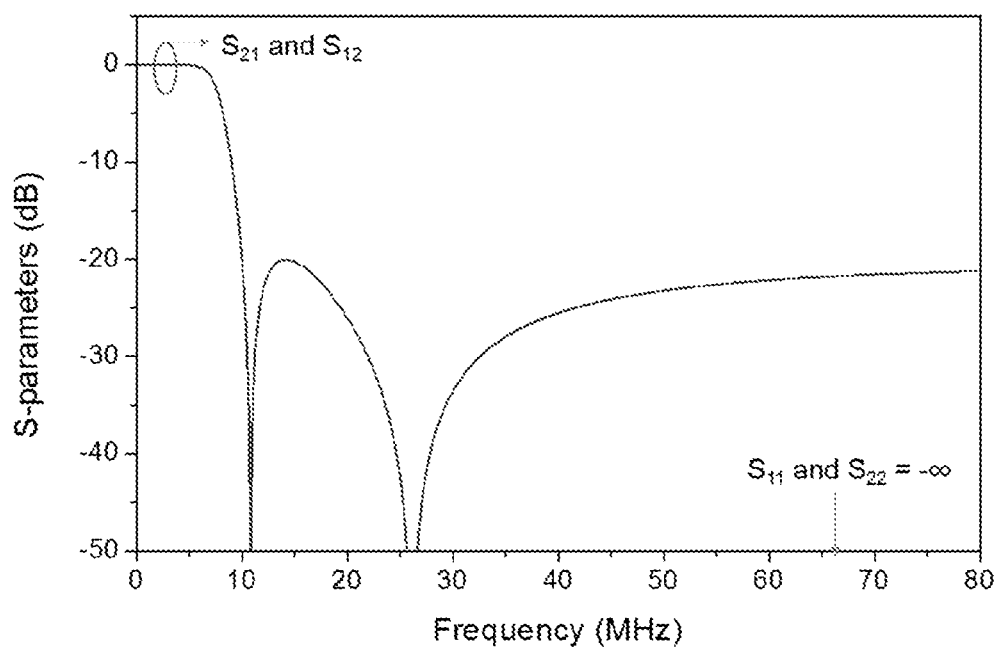
FIG. 19 illustrates the frequency responses of the fourth-order 20 dB inverse-Chebyshev lowpass filter.
Figure 20:
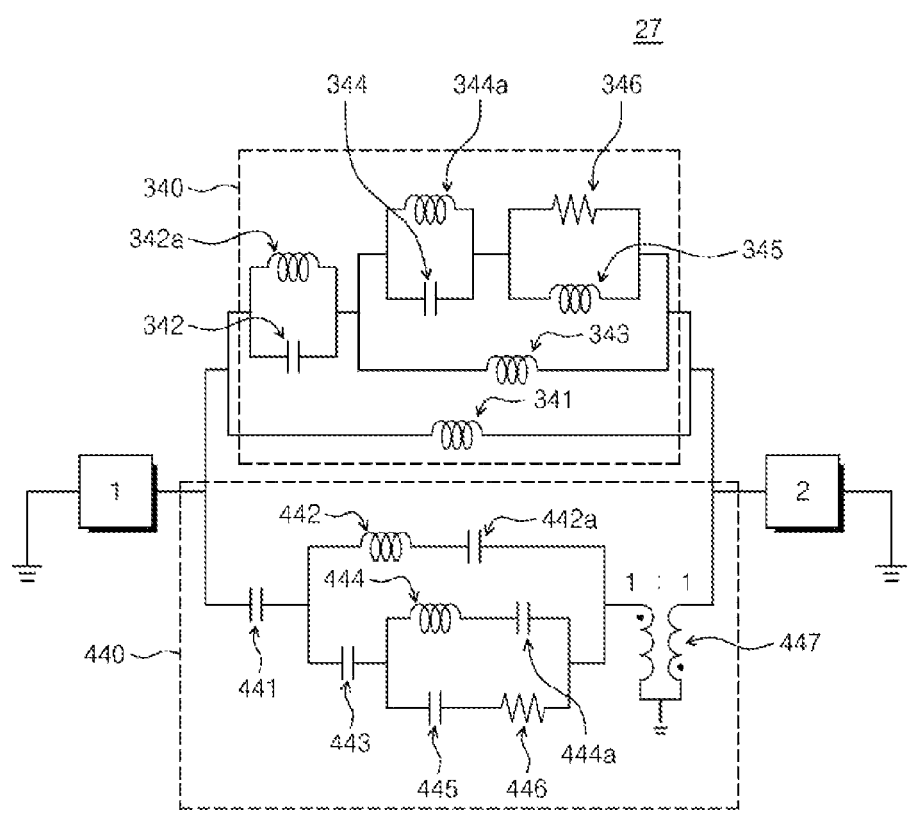
FIG. 20 shows the circuit diagram of a fifth-order (reflectionless) elliptic lowpass filter, the eleventh embodiment of the reflectionless frequency filter circuit.

FIG. 16 shows the circuit diagram of a third-order Butterworth lowpass filter, and FIG. 17 shows its frequency responses. The impedance scaling to the elements has been applied to the normalized element values so as to have the port impedance rather than 1. Simultaneously, the frequency scaling to the elements has been applied to the normalized element values so as to have the cutoff frequency rather than 1. Furthermore, lowpass-to-highpass, lowpass-to-bandpass, and lowpass-to-bandstop frequency transformations can also be applied so as to have a reflectionless bandpass, highpass, and bandstop filters.

For example, a third-order Butterworth reflectionless lowpass filter having the input/output port impedance of 50Ω and a cutoff frequency of 10 MHz can be designed using the reflectionless filter circuit 25. The element values are given as the following. The element values of the first inductor 351, the first capacitor 352, the second inductor 353, and the first resistor 354 in the first circuit 350 are given by 1.59 uH, 79.6 pF, 1.59 uH and 100Ω, respectively. The element values of the first capacitor 451, the first inductor 452, the second capacitor 453, and the first resistor 454 in the second circuit 450 are given by 159 pF, 796 nH, 159 pF, and 100Ω, respectively. Referring to S-parameters in FIG. 17, it can be observed that the reflectionless filter circuit 25, the ninth embodiment, produces the third-order Butterworth lowpass transmission responses while having zero reflections, as expected. As the reflections are zero, the negative infinity values for $S_{11}$ and $S_{22}$ are provided in terms of dB.

For another example, a fourth-order 20 dB inverse-Chebyshev reflectionless lowpass filter having the input/output port impedance of 50Ω and a ripple cutoff frequency of 10 MHz can be designed using the reflectionless filter circuit 26. The element values are given as the following. The element values of the first inductor 361, the first capacitor 362, the second inductor 363, the second capacitor 364, and the first resistor 364 in the first circuit 360 are given by 1.71 uH, 123 pF, 1.01 uH, 209 pF, and 81.9Ω respectively. The element values of the first capacitor 461, the first inductor 462, the second capacitor 463, the second inductor 464, and the first resistor 465 in the second circuit 460 are given by 171 pF, 1.23 uH, 101 pF, 2.09 uH, and 122.1Ω. Referring to S-parameters in FIG. 17, it can be observed that the reflectionless filter circuit 26, the tenth embodiment, produces the fourth-order 20 dB inverse-Chebyshev lowpass transmission responses while having zero reflections, as expected.

Figure 21:
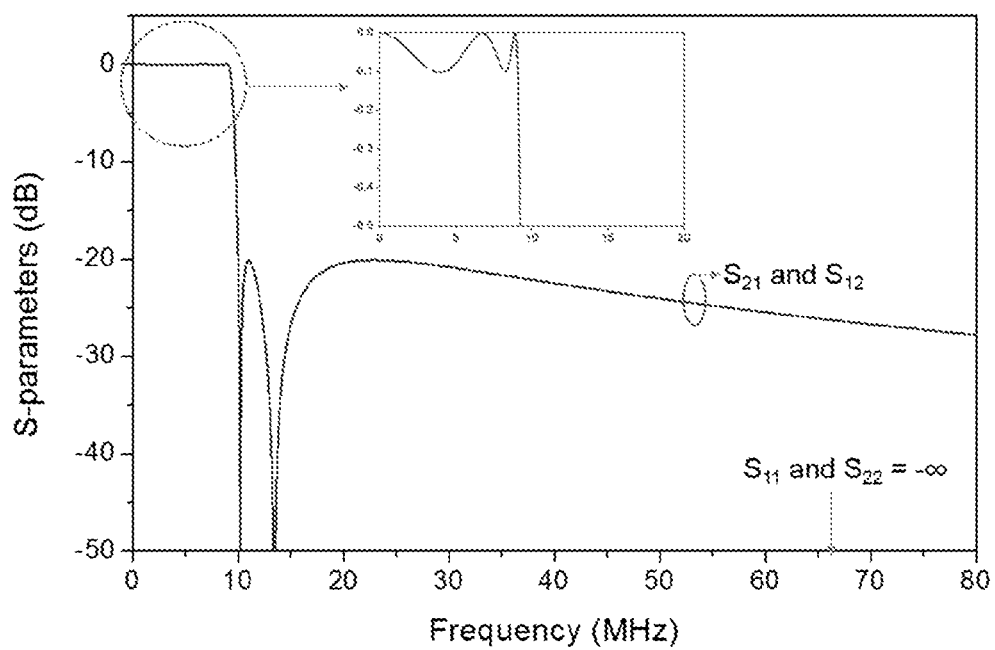
FIG. 21 illustrates the frequency responses of the fifth-order elliptic lowpass filter.

For another example, a fifth-order elliptic reflectionless lowpass filter with 0.1 dB ripple at the passband, and 20 dB ripple at the stopband, having the input/output port impedance of 50Ω and a ripple cutoff frequency of 10 MHz can be designed using the reflectionless filter circuit 27. The element values are given as the following. The element values of the first inductor 371, the first capacitor 372, the second inductor 372a, the third inductor 373, the second capacitor 374, the fourth inductor 374a, the fifth inductor 375, and the first resistor 376 in the first circuit 370 are given by 2.49 uH, 178.89 pF, 3.11 uH, 1.38 uH, 522.82 pF, 611 nH, 21.47 uH, and 100Ω, respectively. The element values of the first capacitor 471, the first inductor 472, the second capacitor 472a, the third capacitor 473, the second inductor 474, the fourth capacitor 474a, the fifth capacitor 475, and the first resistor 476 in the second circuit 470 are given by 249 pF, 1.79 uH, 311 pF, 138 pF, 5.23 uH, 61.1 pF, 2.15 nF, and 100Ω, respectively. Referring to S-parameters in FIG. 21, it can be observed that the reflectionless filter circuit 27, the eleventh embodiment, produces the fifth-order elliptic transmission responses with 0.1 dB ripple at the passband, and 20 dB ripple at the stopband while having zero reflections, as expected.

Figure 22:
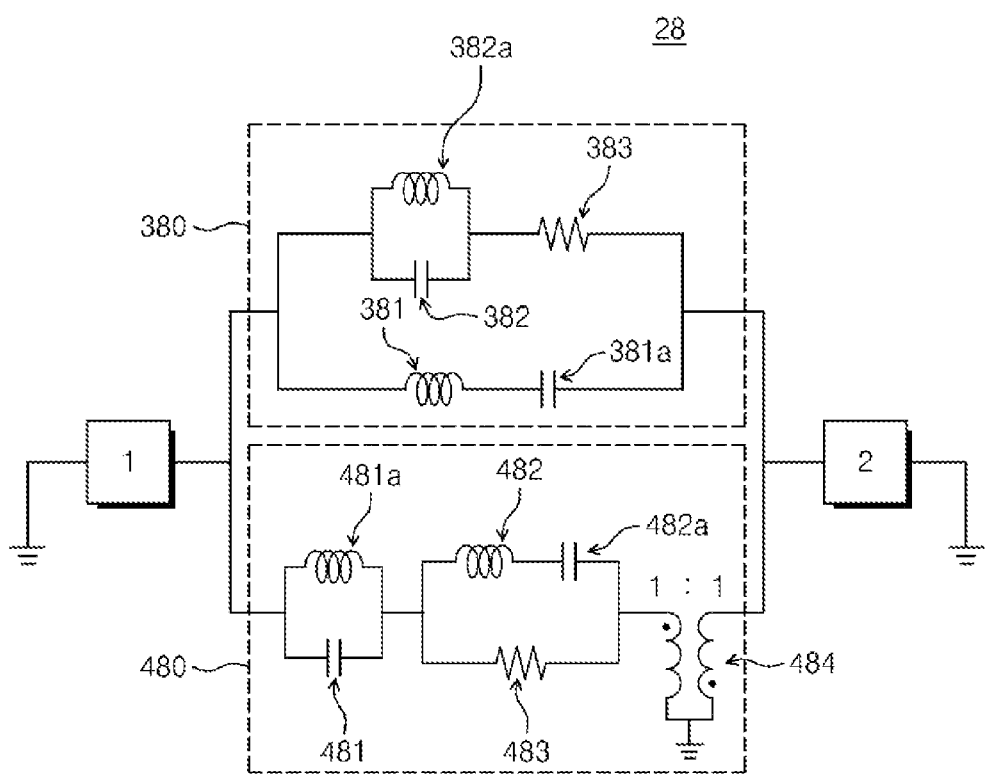
FIG. 22 shows the circuit diagram of a second-order (reflectionless) 20 dB inverse-Chebyshev bandpass filter, the eleventh embodiment of the reflectionless frequency filter circuit.
Figure 23:
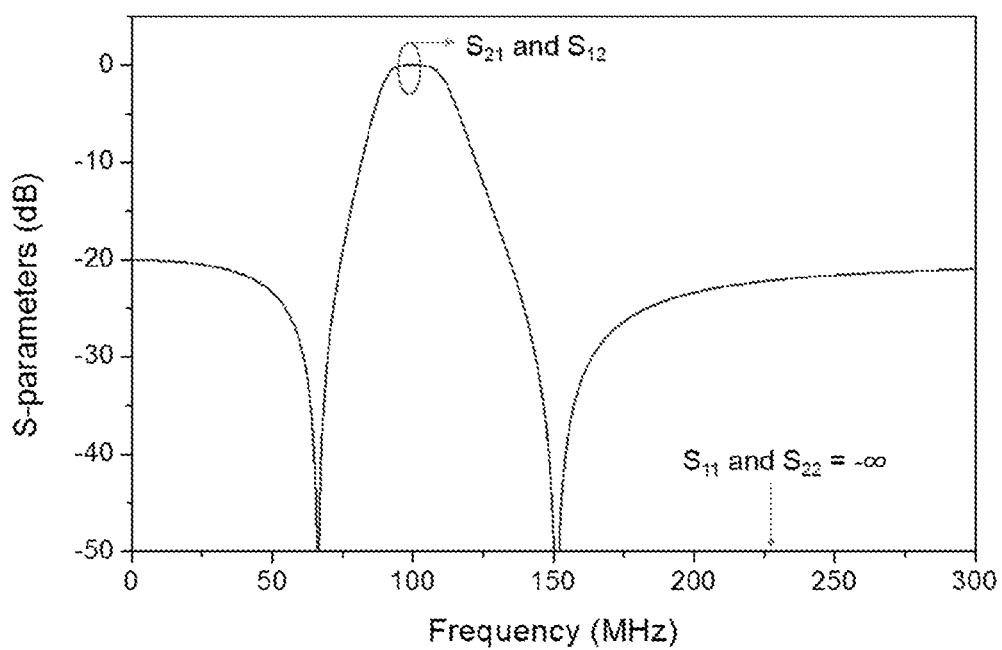
FIG. 23 illustrates the frequency responses of the second-order 20 dB inverse-Chebyshev bandpass filter.

For another example, a second-order 20 dB inverse-Chebyshev reflectionless bandpass filter can be designed by applying the lowpass-to-bandpass frequency transformations to the second-order 20 dB inverse-Chebyshev reflectionless lowpass filter. It has been designed such that the input/output port impedance are 50Ω with a ripple bandwidth of 60 MHz. The element values are given as the following. The element values of the first inductor 381, the first capacitor 381a, the second capacitor 382, the second inductor 382a, and the first resistor 383 in the first circuit 380 are given by 399 nH, 6.35 pF, 48.72 pF, 52 nH, and 81.9Ω, respectively. The element values of the first capacitor 481, the first inductor 481a, the second inductor 482, second capacitor 482a, and the first resistor 483 of the second circuit 480 are given by 39.9 pF, 63.48 nH, 5.2 pF, 487.16 nH, and 122.1Ω, respectively. Referring to S-parameters in FIG. 22, it can be observed that the reflectionless filter circuit 28, the twelfth embodiment, produces the second-order 20 dB inverse-Chebyshev bandpass transmission response while having zero reflections, as expected.

At least one of the above-described frequency filter circuits 10 to 14 and 21 to 27 may be used in an integrated circuit for performing signal processing and/or in various electronic elements requiring such as signal processing. For example, the frequency filter circuits 10 to 14 and 21 to 27 described above may be used in a communication element or system capable of communicating with other external elements. In detail, for example, the reflectionless frequency filter circuits 10 to 14 and 21 to 27 may be used for an electronic element (e.g., a wireless communication element) including a wireless communication module, or an integrated circuit corresponding thereto, and/or a wireless communication system including the same, or may be used for a wired communication device and/or wired communication system including a wired communication module or an integrated circuit corresponding thereto. In this case, the frequency filter circuits 10 to 14 and 21 to 27 may be integrally formed and used in an integrated circuit of a wireless communication module or a wired communication module, integrally formed and used in an integrated circuit such as a processor, and/or separately modularized, additionally mounted, and used in a processor, a wireless communication module, or a wired communication module. In addition, the above elements may use only one of the frequency filter circuits 10 to 14 and 21 to 27, or may use two or more frequency filter circuits 10 to 14 and 21 to 27. Here, the communication device or communication system may include, for example, various devices or systems, such as a radar element, a mobile communication base station, a wireless router, a vehicle, an air vehicle (including a manned vehicle and an unmanned aerial vehicle such as a drone), an artificial satellite, satellite communication systems for an operation of the artificial satellite, a terrestrial base station for satellite communication, various control devices (e.g., a radar access control device), a smartphone, a cellular phone, a laptop computer, a desktop computer, a tablet PC, a set-top box, a robot, a mechanical device, a medical device, and/or a construction machinery, but is not limited thereto. In addition to the communication device or system, the frequency filter circuits 10 to 14 and 21 to 27 may be used by various other device or systems, such as a data processing element or system for processing text, images, and/or audio.

Although the reflectionless frequency filter circuit has been described in various embodiments above, the reflectionless frequency filter circuit is not limited only to the above-described embodiments. Various circuits or devices that are changed or modified based on the above-described embodiment by a person of ordinary skill in the art to be implemented may also be an example of the above-described reflectionless frequency filter circuit. For example, although each circuit or component of the described circuit or device is arranged, coupled, or combined in a form different from the illustrated examples, or is replaced or substituted by another equivalent circuit, other component, or equivalents, these may be an embodiment of the above-described reflectionless frequency filter circuit.

According to the above-described reflectionless frequency filter circuit, it is possible to implement the reflectionless frequency filter circuit that can produce more diverse transmission response characteristics than the other reflectionless filter structures based thereon.

In addition, it is possible to implement the circuit having the response in which the ripple exists in the passband, such as a Chebyshev filter, and the circuit having the response in which ripple exists in both the pass-band and stop-band, such as the elliptic filter.

In addition, the element value may be derived from the response of the filter to be implemented, using the analytical method without numerical analysis and optimization, and the denormalized reflectionless filter can be designed using the general denormalization process.

Further, reflectionless filter whose impedance at the input/output terminal is not 1 can designed using the impedance scaling, the reflectionless low pass filter with a cutoff frequency of other than 1 can designed by applying frequency scaling, the band pass filter or the high pass filter that passes signals of frequencies other than the low frequency can designed using the frequency conversion process, and the band-stop filter that blocks the signal transmission in a specific band frequency can designed.

In addition, the reflectionless circuit that blocks or minimizes the reflection of the input signal in the low frequency band while not using or using an isolator to a minimum may be implemented, to reduce the overall volume of the filter circuit and to improve the complexity. Accordingly, it is possible to obtain an effect of reducing the cost and design/manufacturing period in manufacturing the filter circuit, thereby improving economic efficiency in the production of the circuit or device.

What is claimed is:

1. A frequency filter circuit comprising:
   a first partial circuit comprising a first inductor, a first capacitor connected in parallel with the first inductor, and a first resistor connected in series with the first capacitor;
   a second capacitor connected in parallel with the first partial circuit;
   a first inverter connected in series with the second capacitor;
   a third capacitor connected in series with the first inverter; and
   a third resistor connected in series with the third capacitor.

2. A reflectionless frequency filter circuit comprising:
   a first partial circuit comprising a first inductor and a first resistor;
   a first inverter connected in parallel with the first partial circuit; and
   a third partial circuit connected in series with the first inverter,
   wherein the third partial circuit comprises:
   a third inductor; and
   a third resistor disposed on a branch line between the first inverter and the third inductor,
   wherein the first partial circuit further comprises a first capacitor disposed between the first inductor and the first resistor, and a first branch inductor disposed on a branch line between the first capacitor and the first resistor.

3. The frequency filter circuit of claim 2, further comprising a second partial circuit disposed symmetrically with the first partial circuit,
   wherein the second partial circuit comprises:
   a second inductor connected in series with the first inductor; and
   a second resistor connected in series with the first resistor.

4. The frequency filter circuit of claim 3, wherein the first to third inductors have a same inductance value as each other and the first to third resistors have a same resistance value as each other.

5. The frequency filter circuit of claim 2, wherein the first partial circuit further comprises a first parallel connection inductor connected in parallel with the first capacitor.

6. The frequency filter circuit of claim 2, wherein the third partial circuit further comprises a third capacitor disposed on a branch line between the first inverter and the third inductor and disposed between the first inverter and the third resistor.

7. The frequency filter circuit of claim 6, wherein the third partial circuit further comprises a third branch inductor disposed on a branch line between the third capacitor and the third resistor.

8. The frequency filter circuit of claim 7, wherein the third partial circuit further comprises a third parallel connection inductor connected in parallel with the third capacitor.

9. A frequency filter circuit comprising:
   a first circuit comprising a first inductor and a first resistor which are connected in parallel with each other; and
   a second circuit connected in parallel with the first circuit and comprising a second capacitor, a second resistor, and a converter, which are connected in series with one another,
   wherein the first circuit further comprises:
   a first capacitor connected in parallel with the first inductor and connected in series with the first resistor; and
   a third inductor connected in series with the first capacitor and connected in parallel with the first resistor.

10. The frequency filter circuit of claim 9, wherein the first circuit further comprises a first parallel connection inductor connected in parallel with the first capacitor and connected in series with the first resistor.

11. The frequency filter circuit of claim 9, wherein the second circuit further comprises:
    a third capacitor connected in series with the first capacitor and the second resistor; and
    a second inductor connected in parallel with the third capacitor and the second resistor.

12. The frequency filter circuit of claim 11, wherein the second circuit further comprises a fourth capacitor connected in series with the second inductor.

13. The frequency filter circuit of claim 9, wherein the first inductor has a normalized inductance value of four times a normalized capacitance value of the second capacitor and the first resistor has a normalized resistance value of ¼ times a normalized resistance value of the second resistor.

* * * * *